(12) United States Patent
Kimoto

(10) Patent No.: US 8,476,919 B2
(45) Date of Patent: Jul. 2, 2013

(54) PROBER UNIT

(76) Inventor: Gunsei Kimoto, Minato-ku (JP)

( * ) Notice: Subject to any disclaimer, the term of this patent is extended or adjusted under 35 U.S.C. 154(b) by 464 days.

(21) Appl. No.: 12/712,734

(22) Filed: Feb. 25, 2010

(65) Prior Publication Data

US 2011/0204911 A1    Aug. 25, 2011

(51) Int. Cl.
*G01R 31/02* (2006.01)
*G01R 1/067* (2006.01)

(52) U.S. Cl.
USPC .............................. 324/754.03; 324/755.01

(58) Field of Classification Search
None
See application file for complete search history.

(56) References Cited

U.S. PATENT DOCUMENTS

| | | | | |
|---|---|---|---|---|
| 6,731,123 B2 * | 5/2004 | Kimoto | ..................... | 324/756.03 |
| 2007/0063718 A1 * | 3/2007 | Kimoto | ......................... | 324/754 |
| 2007/0268031 A1 * | 11/2007 | Di Stefano | ..................... | 324/754 |
| 2008/0094090 A1 * | 4/2008 | Kimoto | ......................... | 324/762 |

FOREIGN PATENT DOCUMENTS

| | | |
|---|---|---|
| JP | 2003075503 A | 3/2003 |
| JP | 2007279009 A | 10/2007 |

* cited by examiner

*Primary Examiner* — Jermele M Hollington
(74) *Attorney, Agent, or Firm* — Browdy and Neimark, PLLC

(57) ABSTRACT

A prober unit in which probes are brought into contact with to-be-tested semiconductor chips to establish electrical connection between the semiconductor chips and a test unit via the probes. A probe assembly and a plurality of wiring boards are prepared, the probe assembly being constituted by integrated regularly-arranged multiple probe groups including output terminals connected directly to the probes, and each of the wiring boards including wiring adhering to a surface of a non-conductive film; and an n-th row of an output terminal group of the probe assembly is brought into contact with a land group provided at an end of an n-th wiring board, and a wiring terminal provided at the other end of the n-th wiring board is connected to one of a wiring board of the test unit and a connector to establish electrical connection between the to-be-tested semiconductor chips and the test unit.

8 Claims, 11 Drawing Sheets

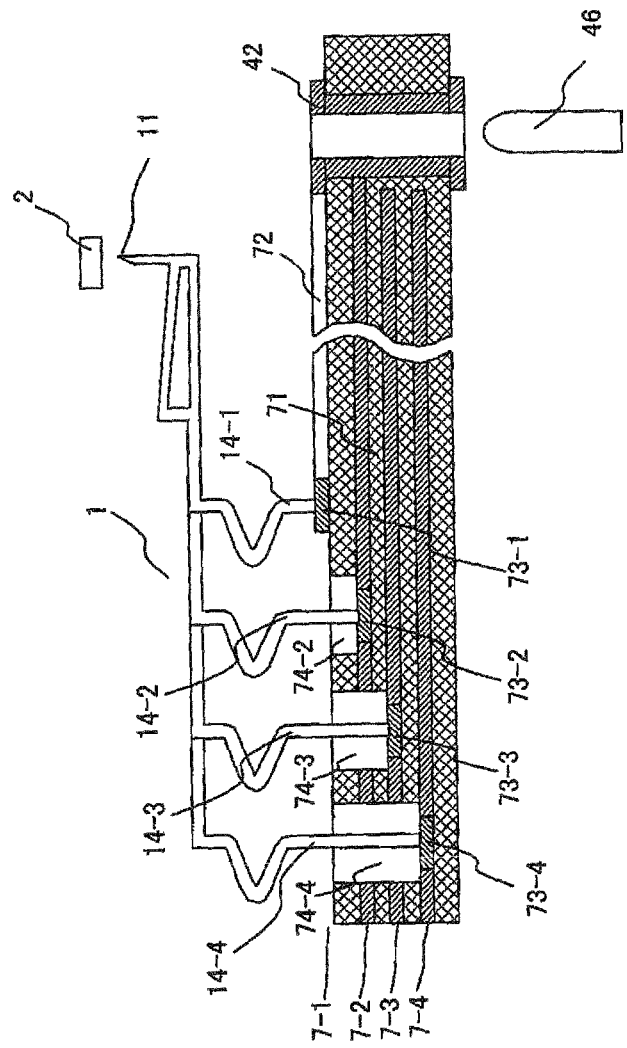

PROBER UNIT

BACKGROUND OF THE INVENTION

1. Field of the Invention

The present invention relates to a probe assembly of a prober unit for testing circuits of semiconductor chips on a semiconductor wafer during fabrication of electronic devices including LSI. More particularly, the invention relates to a prober unit used for probe testing. In the probe testing, circuit terminals (i.e., pads) that are present on the semiconductor chips on the semiconductor wafer are moved into contact with probes to collectively test the electrical conductivity of the semiconductor chips at the wafer level, before the wafer is diced.

2. Description of the Related Art

As the semiconductor technology advances, highly integrated electronic devices have become more and more common. The circuit terminals (i.e., pads) on the wafer chip have also increased in number. The pads have been arranged more precisely in reduced pad areas at narrowed pad pitches.

Also in probe cards used in semiconductor circuit testing, in which the pads on the semiconductor circuits are brought into electrical connection with a probe group, the probes have been arranged more densely for increased number of pads on the semiconductor chip, reduced pad areas or narrowed pad pitches.

In a general probe card, as disclosed in Japanese Unexamined Patent Application Publication (JP-A) No. 2003-075503, a narrow-pitched probe assembly is disposed at a central portion of a printed circuit board having standard, coarse-pitched lands or through holes at an outer periphery thereof to be connected to a test unit. High-density wiring near the probe assembly is connected to standard, coarse-pitched pads or through holes at an outer periphery of a common wiring board using, for example, flexible flat cables.

As another approach, a probe assembly may be fabricated using laminated multiple resin film probes as disclosed in JP-A-2007-279009. Each resin film probe includes a conductive section with a probe and an output terminal section. The conductive section is produced by etching a sheet of copper alloy foil adhering to a resin film. The output terminal sections formed on the resin films are arranged to be shifted from each other in coarse pitches when the resin film probes are laminated together. With this configuration, the output terminal sections can be connected with a printed circuit board in certain coarse pitches even in the vicinity of the probe assembly, thereby reducing the number of layers of the printed circuit boards or simplifying the wiring.

However, if the connection is established only linearly at one ends of the flexible flat cables as disclosed in JP-A-2003-075503, mounting of the probe assembly onto the printed circuit board and therefore achievement of the positional accuracy at the connecting sections may become difficult because of congestion of the flexible flat cables for further narrowed pad pitches, increased number of pins or varied pad arrangement of the semiconductor circuits.

Further, if the connection of the output terminals of the probe assembly is established only on the surface layer of the printed circuit board as disclosed in JP-A-2007-279009, the printed circuit board must include multiple layers and the resin film probes must increase in size in order for further narrowed pad pitches.

In view of the aforementioned, an object of the invention is to provide a prober unit which incorporates a probe assembly developed to correspond to narrow-pitched pad arrangements on semiconductor chips in order to solve problems regarding connection between a narrow-pitched probe assembly and coarse-pitched printed circuit boards or connection terminals of connectors. With the prober unit, testing of electrical property of narrowed pad pitches on semiconductor chips can be facilitated and the cost of the prober unit can be reduced.

SUMMARY OF THE INVENTION

A first aspect of the invention is a prober unit in which probes are brought into contact with to-be-tested semiconductor chips to establish electrical connection between the semiconductor chips and a test unit via the probes, in which: a probe assembly and a plurality of wiring boards are prepared, the probe assembly including output terminals to be connected directly to the probes, the probe assembly being constituted by integrated regularly-arranged multiple probe groups including the output terminals, and each of the wiring boards including wiring adhering to a surface of a non-conductive film; and an n-th row of an output terminal group of the probe assembly is brought into contact with a land group provided at an end of an n-th wiring board, and a wiring terminal provided at the other end of the n-th wiring board is connected to one of a common wiring board and a connector to establish electrical connection between the to-be-tested semiconductor chips and the test unit.

In an embodiment of the invention, an opening is provided at an area of one of a non-conductive section and a conductive section of a wiring board above the n-th wiring board including the n-th wiring board, above a land group that is to be brought into contact with a (n+1)th row of the output terminal group of the probe assembly formed at an area of the (n+1)th wiring board disposed below the n-th wiring board. With this configuration, since the output terminal group of the probe assembly can be connected directly to intermediate layers of the wiring boards, a narrow-pitched output terminal group can be employed.

In an embodiment of the invention, some or all of the wiring boards are made of flexible flat cables.

In an embodiment of the invention, some or all of the wiring boards are made of multilayer print circuit boards.

In an embodiment of the invention, a converting circuit board is provided between wiring terminals of the wiring boards and the common wiring board. With this configuration, an existing common wiring board can be employed.

In an embodiment of the invention, the probe assembly is fabricated from multiple resin film probes laminated using a support rod, each of the resin film probes including a conductive section having the probes and output terminal sections, the conductive section being fabricated by etching a sheet of copper alloy foil adhering to resin films.

In an embodiment of the invention, the output terminal sections on the resin films are shifted from one another at substantially regular pitches when the resin film probes are laminated together.

In an embodiment of the invention, the support rod used for laminating the resin film probes and the wiring boards are restrained in at least a direction of an XY plane (i.e., a direction of a wafer plane) by a support provided on the same support plate.

In an embodiment of the invention, at least the support plate is made of a material having a thermal expansion coefficient similar to that of the semiconductor wafer.

According to the prober unit of the invention, a probe assembly and a plurality of wiring boards are prepared, the probe assembly including output terminals to be connected directly to the probes and the probe assembly being constituted by integrated regularly-arranged multiple probe groups including the output terminals. In addition, an n-th row of an output terminal group of the probe assembly is brought into contact with a land group provided at an end of an arbitrary n-th wiring board, and a wiring terminal provided at the other end of the n-th wiring board is connected to one of a common wiring board and a connector to establish electrical connection between the to-be-tested semiconductor chips and the test unit. With this configuration, the problems on connection of a narrow-pitched probe assembly and coarse-pitched printed circuit board or connection terminals of connectors can be solved. Thus, testing of electrical property of narrowed pad pitches on semiconductor chips can be facilitated and the cost of the prober unit can be reduced.

BRIEF DESCRIPTION OF THE DRAWINGS

FIG. 11 is a cross-sectional view of a central portion of FIG. 10.

DESCRIPTION OF THE PREFERRED EMBODIMENTS

Figure 1:
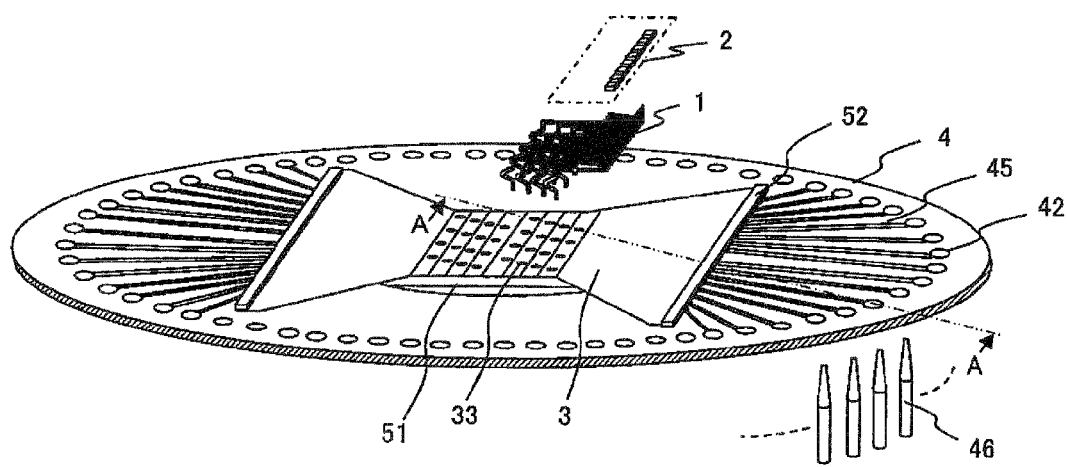
FIG. 1 is a perspective view of a first embodiment of the invention.
Figure 2:
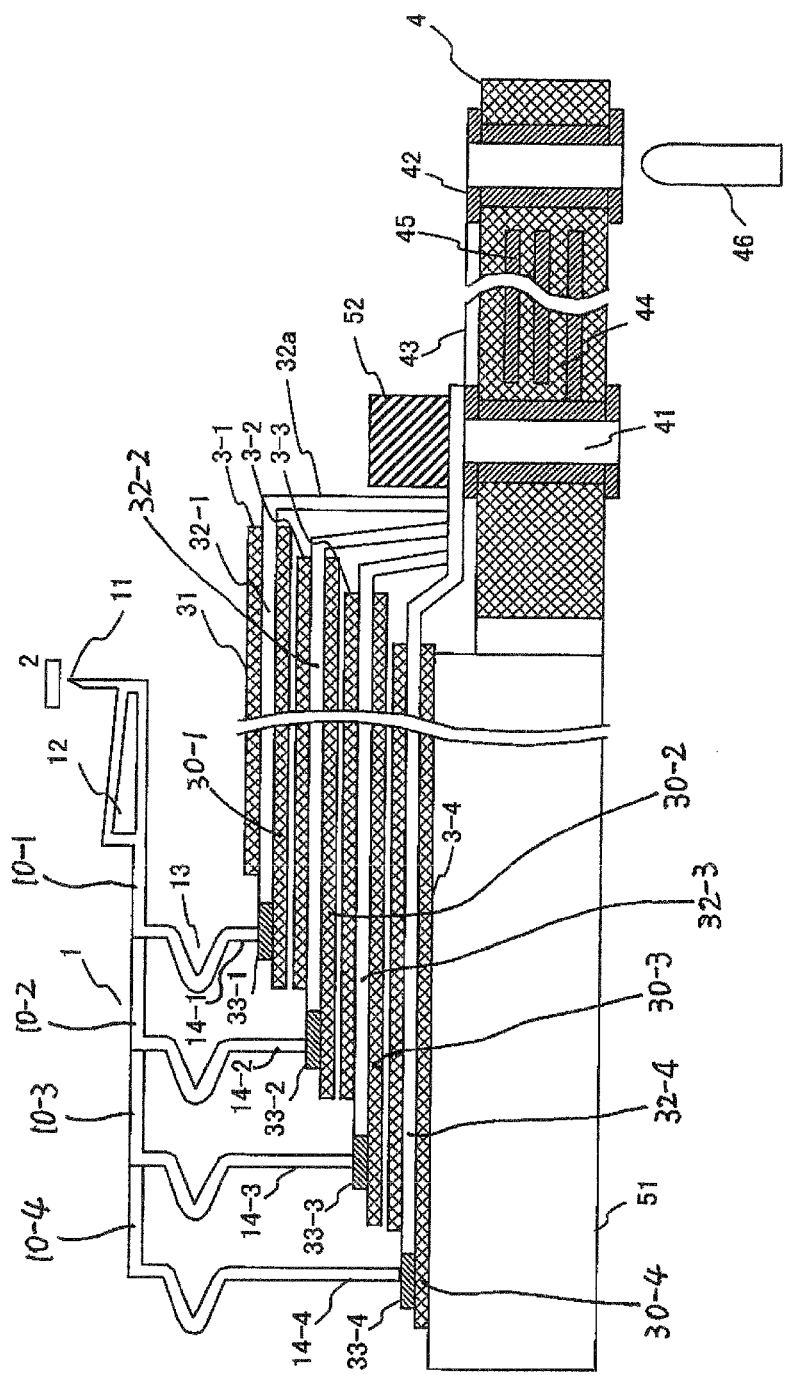
FIG. 2 is a cross-sectional view of a central portion of FIG. 1.
Figure 3:
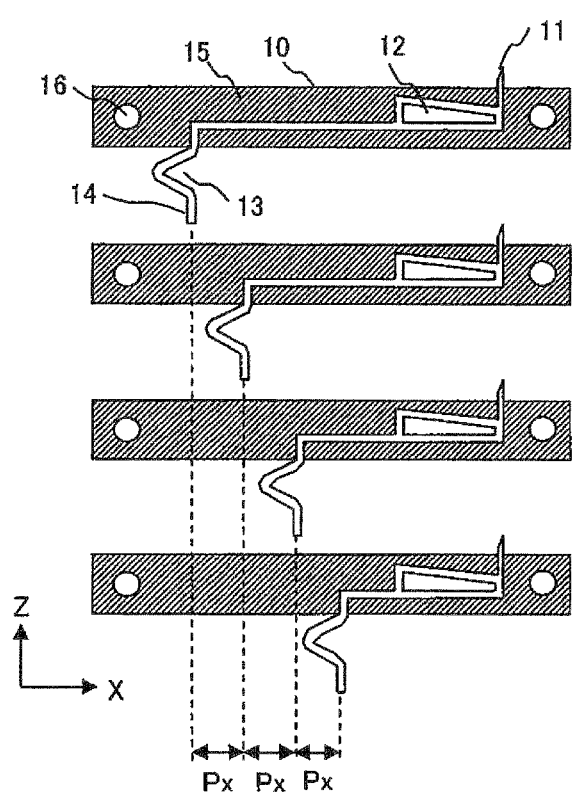
FIG. 3 is a front view of a probe assembly configuration relating to the first embodiment.
Figure 4:
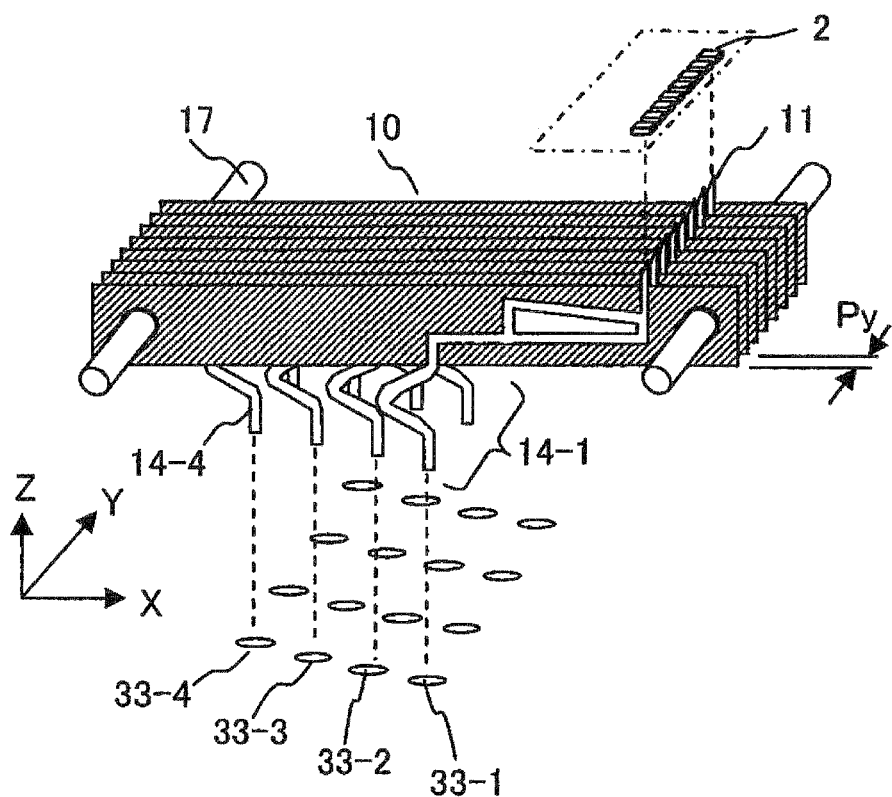
FIG. 4 is a perspective view of the probe assembly configuration relating to the first embodiment.
Figure 5:
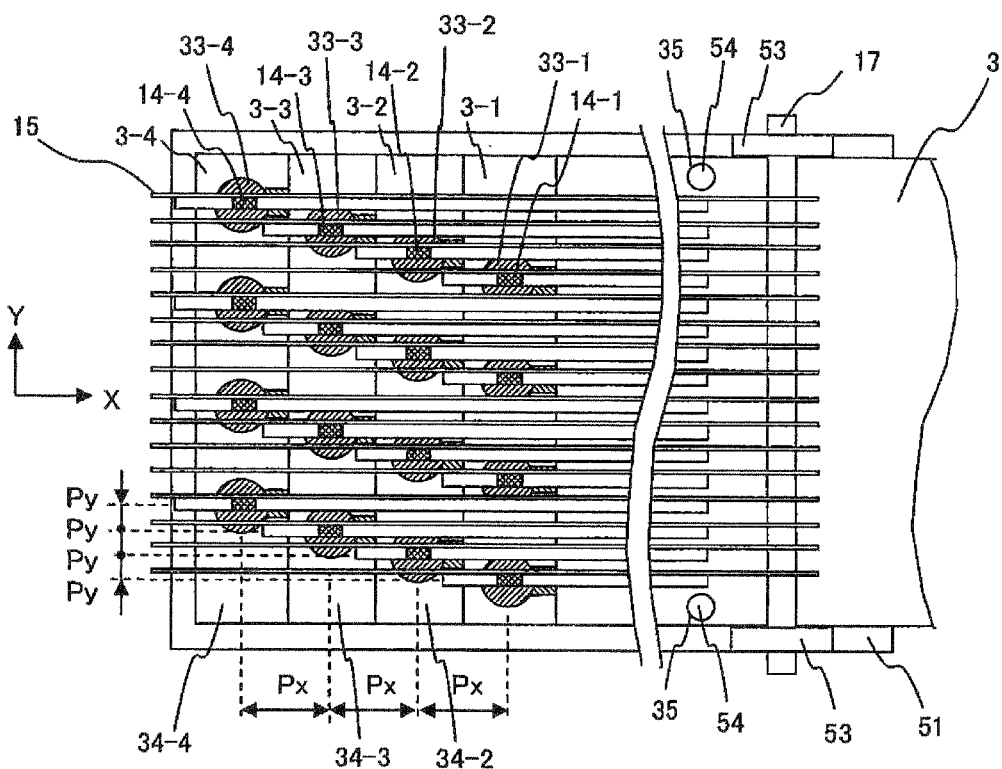
FIG. 5 is a plan view of the central portion of FIG. 1 illustrating the first embodiment of the invention.
Figure 6:
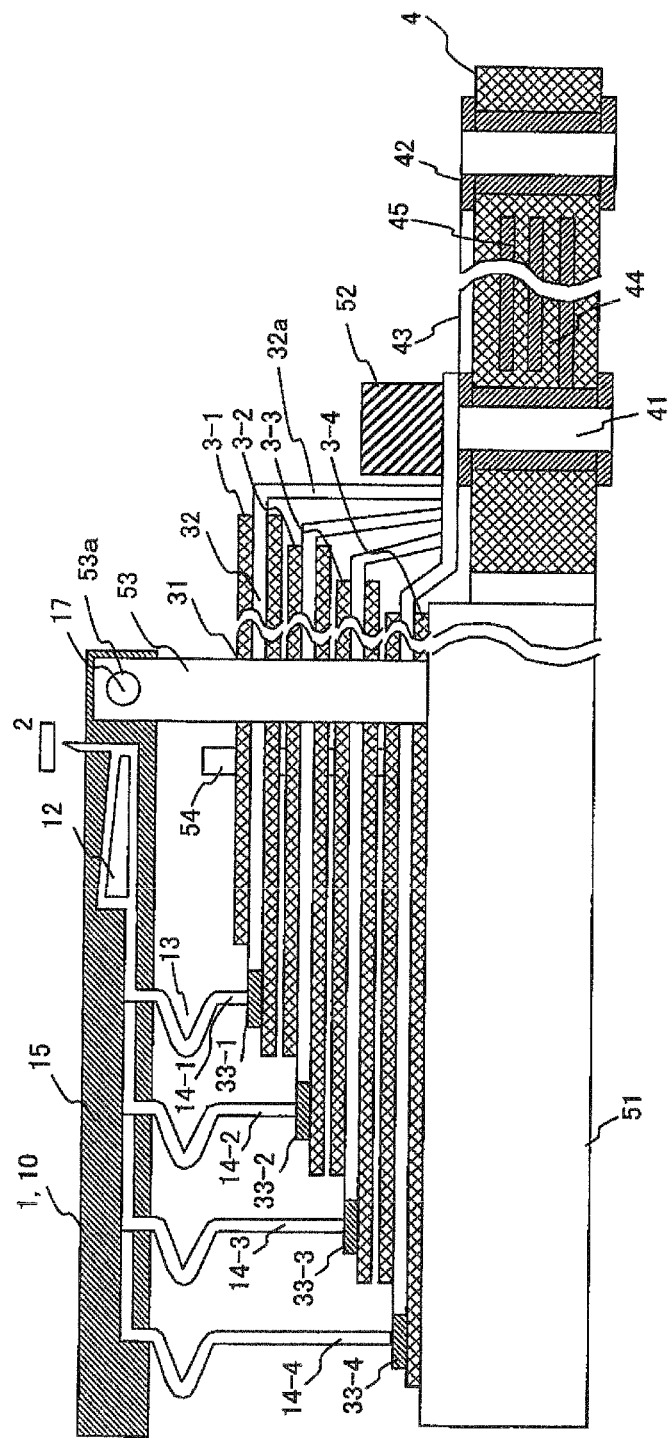
FIG. 6 is a cross-sectional view of the central portion of FIG. 1.

Referring now to the drawings, embodiments of the invention will be described in detail. FIG. 1 is a perspective view schematically illustrating a configuration of a prober unit according to a first embodiment of the invention. FIG. 2 is a detailed cross-sectional view of a probe assembly disposed at a central portion of the prober unit shown in FIG. 1. FIGS. 3 and 4 illustrate a probe assembly configuration. FIG. 5 is a front view of the central portion of FIG. 1. FIG. 6 is a cross-sectional view illustrating a positional relationship among the probe assembly, wiring boards and a common wiring board.

The prober unit illustrated in FIGS. 1 and 2 includes a probe assembly 1, LSI pads 2 arranged on an electronic device, such as a wafer, to be tested for inputting/outputting signals, wiring boards 3, a common wiring board 4 and probes 10. Each probe 10 is made of a conductive material and is connected to an output terminal 14. A bending portion 13 is formed in the middle of each probe 10. A plurality of probes 10, each contacting a distribution cable, altogether constitutes a probe assembly. The present embodiment includes probes 10-1 to 10-4 as shown in FIG. 2. The probes 10-1 to 10-4 are arranged in this order in a direction perpendicular to the sheet of FIG. 2 (i.e., the depth direction) from the near side at predetermined intervals. The wiring boards 3 include lands 33-1 to 33-4 for the output terminals to be brought into contact with the probes 10-1 to 10-4. The probe assembly 1 includes probes 10-1 to 10-4 arranged regularly to correspond to the arrangement of the pads 2. Each of the wiring boards 3 includes multiple wiring patterns 32 formed by etching or by bonding on a surface of a horizontally-extending non-conductive film 31 thereof. The wiring patterns 32 are made of a sheet of metallic foil, such as copper foil.

A plurality of non-conductive films 31 and the wiring patterns 32 are laminated in the vertical direction at predetermined intervals to form n layers. The example illustrated in FIG. 2 includes four layers: a first to a fourth layers from above. A second wiring pattern 32-2 extends further than a first wiring pattern 32-1. A third wiring pattern 32-3 extends further than the second wiring pattern 32-2. In this manner, ends of the wiring patterns 32 are visible when seen from above. The lands 33-1 to 33-4 are provided at the respective ends of the wiring patterns 32-1 to 32-4. The lands 33-1 to 33-4 are therefore shifted vertically and horizontally from one another. Each of the lands 33-1 to 33-4 is constituted by a land group including a plurality of lands arranged in the depth direction of the sheet of FIG. 2 at predetermined intervals at an end of each of the wiring boards 3.

The output terminals of the probes 10-1 to 10-4 are suspended above the lands 33-1 to 33-4. Tips of the output terminals of the probes 10-1 to 10-4 are aligned with the lands 33-1 to 33-4 so as to be brought into contact with each other. In order to move the output terminals of the probes 10-1 to 10-4 into contact with the lands 33-1 to 33-4, the probe 10-4 extends further than the probe 10-3 and the output terminal of the probe 10-4 extends further downward than that of the probe 10-3. Similarly, the probe 10-3 extends further than the probe 10-2 and the output terminal of the probe 10-3 extends further downward than that of the probe 10-2. Similarly, the probe 10-2 extends further than the probe 10-1 and the output terminal of the probe 10-2 extends further downward than that of the probe 10-1. Accordingly, the probes 10-1 to 10-4 are disposed to correspond to the lands 33-1 to 33-4 that are shifted vertically and horizontally from one another. In the probe assembly 1, each of the output terminals of the probes 10-1 to 10-4 is constituted by a probe output terminal group including a plurality of output terminals arranged in the depth direction of the sheet of FIG. 2 at predetermined intervals.

Grounding members 30-1 to 30-4 are disposed between the layers of the wiring patterns 32-1 to 32-4. The grounding members 30-1 to 30-4 reduce crosstalk, i.e., interference, of the currents or the signals flowing through the layers of the wiring patterns 32-1 to 32-4.

The foregoing arrangement of the layers of the wiring patterns 32 and the lands 33 are illustrated for the ease of understanding of the invention. In a further generalized arrangement, it is not necessary that the second wiring pattern 32-2 extends further than the first wiring pattern 32-1. Alternatively, the first wiring pattern 32-1 may extend further than the second wiring pattern 32-2. In this configuration, although the second wiring pattern 32-2 is not visible when seen from above, a through hole may be provided at a part of the first wiring pattern 32-1 (including the non-conductive film 31 and the ground 30) in order to expose the second wiring pattern 32-2. The land 33-2 for the second wiring pattern 32-2 is disposed at the exposed area and the tip of the output terminal of the corresponding probe 10-2 is brought into contact with the land 33-2. Although there is a possibility of disconnection in the first wiring pattern 32-1 that includes the through hole, the possibility can be eliminated with the wiring width increased to be sufficiently larger than the diameter of the through hole. The third and the fourth wiring patterns 32-3 and 32-4 may have the same configuration as described above. Accordingly, in some arrangements of the wiring patterns, the through hole may penetrate two or more layers of the wiring patterns.

A common wiring board 4 includes peripheral common lands 42. The common lands 42 are disposed corresponding to positions of common pogo pins 46 for electrical connection with a test unit (not shown). A through hole 41 is formed in the common wiring board 4 for connection with the other ends of the wiring boards.

FIGS. 3 and 4 illustrate configurations of the probe 10 and the probe assembly 1 according to the present embodiment. As shown in FIG. 3, the probe 10 is made of a conductive and mechanically strong material, such as beryllium copper. A parallelogram spring section 12 is provided in the middle of the probe 10 which imparts spring force. When the probe tip 11 and the LSI pad 2 is brought into contact with each other, the probe 10 and the LSI pad 2 are electrically conducted. The bending portion 13 can absorb any external force imparted perpendicularly (i.e., in a Z direction) to the output terminal 14 which is the output section. The output terminal 14 is pressed against the land 33 on the wiring board to establish an electrical connection. Output positions of the output terminals 14 are shifted sequentially in an X direction of a XYZ three-dimensional orthogonal coordinate system by the distance of Px as shown in FIG. 3. A resin film probe 10 having desired precise dimension can be fabricated by, for example, affixing the conductive material to a resin film 15 and then etching the conductive material.

As shown in FIG. 4, a plurality of the resin film probes 10 are stacked and fixed together with a support rod 17 inserted in a hole 16 formed in the resin film 15. In this manner, the probe assembly 1 having the pitch Px in the X direction and having a pitch Py in a Y direction can be obtained. A plurality of (four in the present embodiment) probe groups shifted continuously at the pitch Px in the X direction are periodically combined together. The thus-fabricated probe assembly 1 can be used for narrow, Py-pitched LSI pads. The narrow pitches Py can be converted into relatively coarse pitches Px on the wiring boards.

FIG. 5 shows positional relationships between the output terminals 14 of the probe assembly 1 and the lands 33 on the wiring boards 3 corresponding to the output terminals 14. The land 33-1 is constituted by a land group provided on the first wiring board so as to correspond to a first row 14-1 of the tips of the output terminals of the probe assembly 1 along the Y direction. The land 33-2 is constituted by a land group provided on the second wiring board so as to correspond to a second row 14-2 of the tips of the output terminals of the probe assembly 1 along the Y direction. The land 33-3 is constituted by a land group provided on the third wiring board so as to correspond to a third row 14-3 of the tips of the output terminals of the probe assembly 1 along the Y direction. The land 33-4 is constituted by a land group provided on the fourth wiring board so as to correspond to a fourth row 14-4 of the tips of the output terminals of the probe assembly 1 along the Y direction. An opening 34-n is provided at an area of the n-th wiring board above the pad group that is brought into contact with the (n+1)th row of the output terminal group of the probe assembly 1 formed in the (n+1)th wiring board disposed below the n-th wiring board. With this configuration, the (n+1)th row of the output terminal group of the probe assembly can be brought into direct contact with the lands 33 formed on the (n+1)th wiring board.

The configuration and the function of the prober unit with the foregoing components will be described in further detail below.

The probe assembly 1 that includes the output terminal group 14 having the narrow pitch Py in the Y direction and the coarse pitch Px in the X direction is accurately positioned above the wiring boards with the support rod 17 so as to correspond to the LSI pads 2 (not shown). An opening 34 is provided at an area of the n-th wiring board above the land group that is brought into contact with the (n+1)th row of the output terminal group 14-n of the probe assembly 1 formed in the (n+1)th wiring board disposed below the n-th wiring board 3-n. In this manner, the wiring boards 3 are fixed to the common wiring board 4 via, for example, a support plate 51 at positions where the (n+1)th row of the output terminal group of the probe assembly can be brought into direct contact with the lands formed in (n+1)th wiring board. The other ends of the wiring boards 3 protrude from the non-conductive films 31 to form wiring patterns 32a. The wiring patterns 32a are electrically connected to a surface land of a through hole 41 formed in the common wiring board 4 with pressure by using a pressing tool 52. The through hole 41 is further connected to peripheral common lands 42 via conductive patterns 45 formed on a surface layer 43 and an intermediate layer 44. Common pogo pins 46 communicate with the test unit with electrical signals.

The wiring boards 3 may be formed of multiple single-layer flexible flat cables, or one or more multi-layered stacked flexible flat cables. The other ends of the wiring boards 3 and the through hole 41 formed in the common wiring board 4 may be connected by using a connector or soldered together.

FIG. 6 is a cross-sectional view showing a positional relationship among the probe assembly, the wiring boards and the common board. With reference to FIG. 6, the positional relationship will be described in detail. In FIG. 6, a support plate 51 and a support A 53 provided on the support plate 51 are illustrated. The support A 53 has a hole 53a at an upper portion thereof whose inner diameter is slightly larger than an outer diameter of the support rod 17 used for laminating the resin film probes. The hole 53a positions the support rod 17 with sufficient accuracy. A support B 54 is provided on the support plate 51. An outer diameter of the support B 54 is slightly smaller than an inner diameter of a reference hole 35 provided in each of the wiring boards 3. The support B 54 is inserted in the reference hole 35 to align the wiring boards together in the direction of the XY plane.

With this configuration, the positional relationship among the probe tips of the resin film probes, the tips of the output terminals and the lands on the wiring boards is kept with sufficient accuracy. If the support plate 51 is made of a material having a thermal expansion coefficient substantially similar to that of the semiconductor wafer (e.g., a Fe-36 Ni alloy), the positional relationship among the probe tips, the tips of the output terminals the lands on the wiring boards can be kept with sufficient accuracy without any influence of the thermal expansion of the common wiring board 4 even in high-temperature environments.

Figure 7:
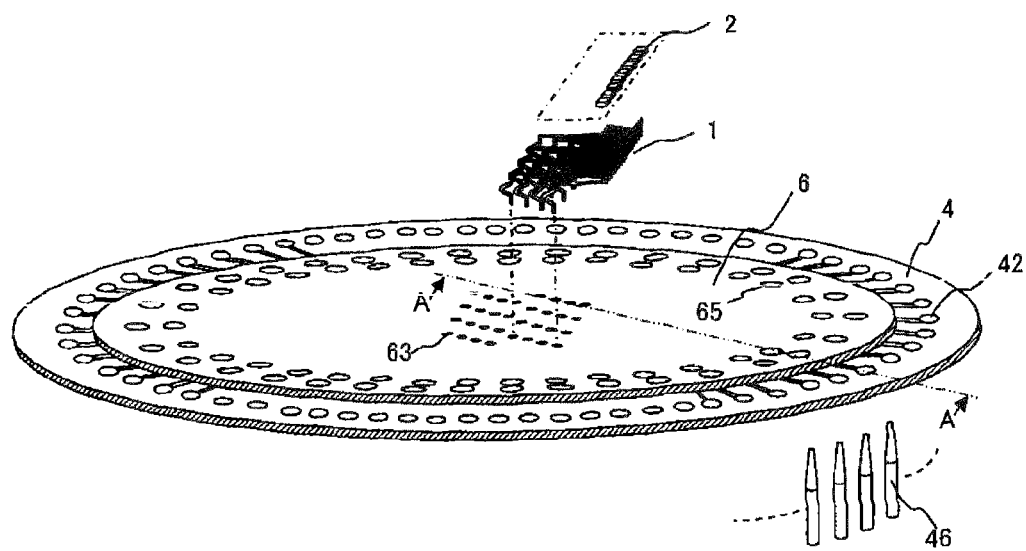
FIG. 7 is a perspective view of a second embodiment of the invention.
Figure 8:
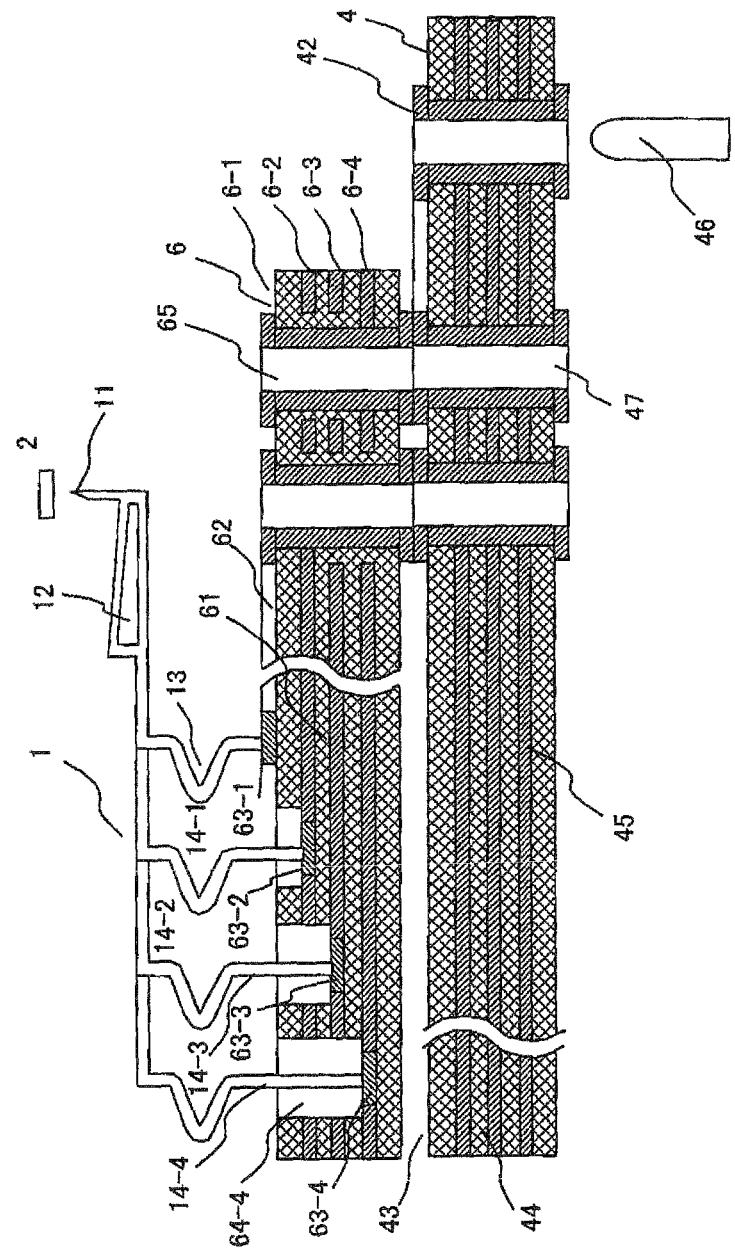
FIG. 8 is a cross-sectional view of a central portion of FIG. 7.
Figure 9:
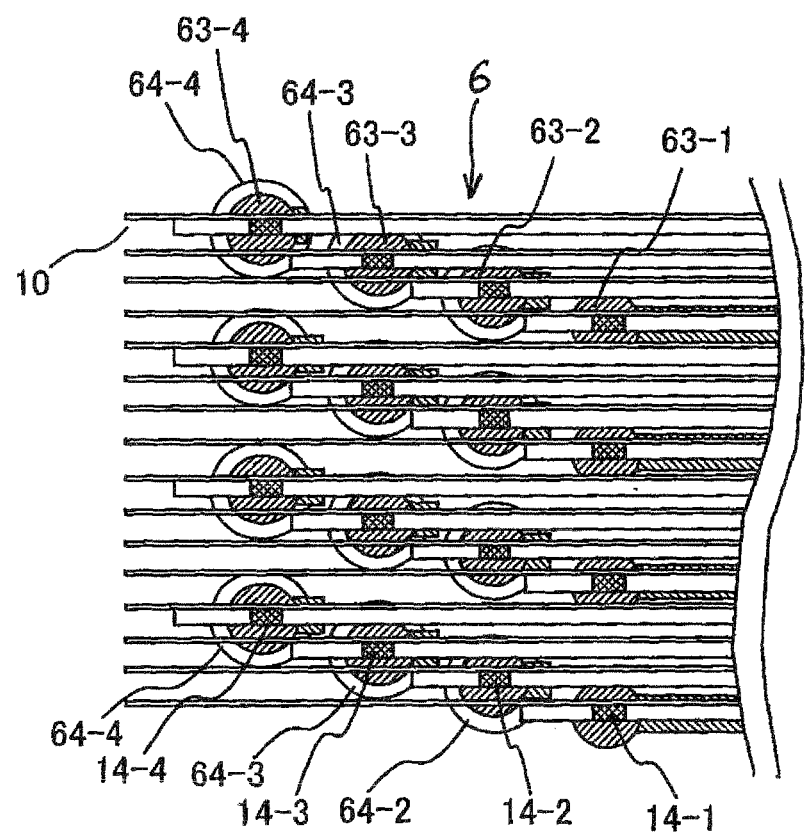
FIG. 9 is a plan view of the central portion of FIG. 7 illustrating the second embodiment.

Referring now to the drawings, a second embodiment of the invention will be described in detail. FIG. 7 is a perspective view of a prober unit according to the present embodiment. FIG. 8 is a cross-sectional view and FIG. 9 is a front view of a central portion of the prober unit. The prober unit shown in FIGS. 7 and 8 includes wiring boards 6 and a common wiring board 4. Each of the wiring boards 6 includes a wiring pattern 62 made of, for example, a sheet of copper foil. The wiring boards 6 are laminated together with intermediate insulating layers 61 interposed therebetween.

The common wiring board 4 includes peripheral common lands 42. The common lands 42 are disposed corresponding to positions of common pogo pins 46 for electrical connection with a test unit (not shown). A through hole 47 is formed in the common wiring board 4 to be connected to a relay through hole 64.

FIG. 9 shows positional relationships between the output terminals 14 of the probe assembly 1 and the lands 63 for the output terminals provided on the wiring boards 6 so as to correspond to the output terminals 14. The land 63-1 is constituted by a land group provided on the first wiring board corresponding to a first row 14-1 of the tips of the output terminals of the probe assembly 1 along the Y direction. The land 63-2 is constituted by a land group provided on the second wiring board corresponding to a second row 14-2 of the tips of the output terminals of the probe assembly 1 along the Y direction. The land 63-3 is constituted by a land group provided on the third wiring board corresponding to a third row 14-3 of the tips of the output terminals of the probe assembly 1 along the Y direction. The land 63-4 is constituted by a land group provided on the fourth wiring board corresponding to a fourth row 14-4 of the tips of the output terminals of the probe assembly 1 along the Y direction. An opening hole 64-$n$ is provided at an area of the n-th wiring board above the pad group that is brought into contact with the (n+1)th row of the output terminal group of the probe assembly 1 formed in the (n+1)th wiring board disposed below the n-th wiring board. With this configuration, the (n+1)th row of the output terminal group of the probe assembly can be brought into direct contact with the lands 63 formed on the (n+1)th wiring board.

The probe assembly 1 that includes the output terminal group 14 having the narrow pitch Py in the Y direction and the coarse pitch Px in the X direction is accurately positioned above the wiring boards with a fixing tool 17 so as to correspond to the LSI pads 2 (not shown). The opening hole 64 is provided at an area of the n-th wiring board above each of the lands that is brought into contact with the (n+1)th row of the output terminal group 14-$n$ of the probe assembly 1 formed in the (n+1)th wiring board disposed below the n-th wiring board 6-$n$. In this manner, the wiring boards 6 are fixed to the common wiring board 4 at positions where the (n+1)th row of the output terminal group of the probe assembly can be brought into direct contact with the lands formed in (n+1)th wiring board. At the outer peripheries of the wiring boards 6, the wiring boards 6 are connected to a relay through hole 65 via the wiring patterns 62 from the lands 63.

The relay through hole 65 is connected to the through hole 47 provided in the common wiring board 4 to keep electrical connection with the common wiring board 4. The relay through hole 65 and the through hole 47 can be connected via, for example, lands of the through holes (illustrated) or via connectors. The through hole 47 is further connected to peripheral common lands 42 via conductive patterns 45 formed on a surface layer 43 and an intermediate layer 44. Common pogo pins 46 communicate with the test unit with electrical signals.

Figure 10:
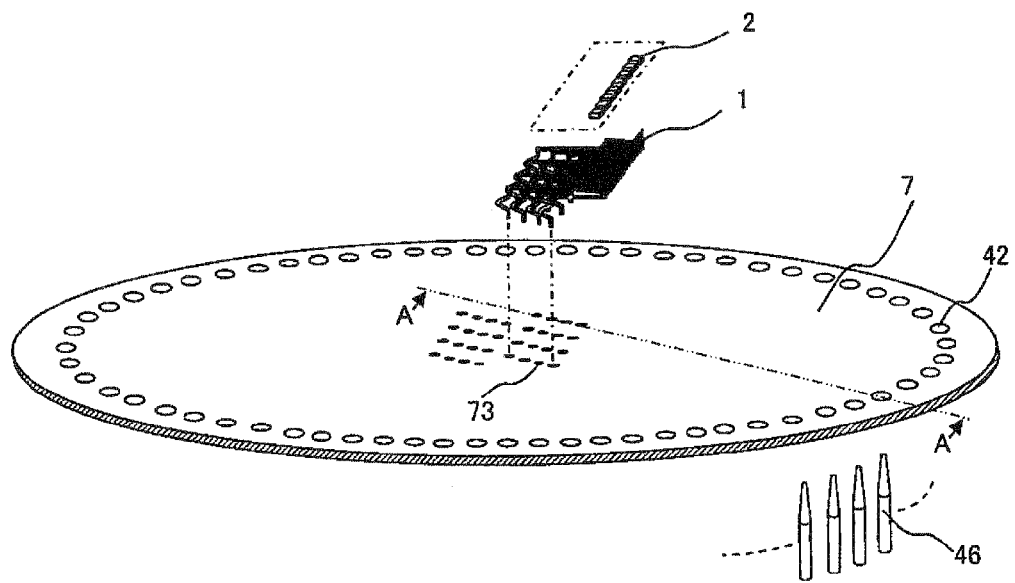
FIG. 10 is a perspective view of a third embodiment.

Referring now to the drawings, a third embodiment of the invention will be described in detail. FIG. 10 is a perspective view of a prober unit according to the present embodiment. FIG. 11 is a cross-sectional view of a central portion of the prober unit shown in FIG. 10. In the third embodiment, functions of the wiring boards 6 and the common wiring board 4 in the second embodiment are integrated together. The prober unit shown in FIGS. 10 and 11 includes wiring boards 7 which are laminated with intermediate insulating layers 71 interposed therebetween. Each of the wiring boards 7 includes a wiring pattern 72 made of, for example, a sheet of copper foil. Each of the wiring boards 7 includes peripheral common lands 42. The common lands 42 are disposed corresponding to positions of common pogo pins 46 for electrical connection with a test unit (not shown).

Since the positional relationship between output terminals 14 of the probe assembly 1 and corresponding lands 73 for the output terminals provided on the wiring boards 7 is similar to that illustrated with reference to FIGS. 8 and 9, description thereof will be omitted.

The probe assembly 1 that includes the output terminal group 14 having the narrow pitch Py in the Y direction and the coarse pitch Px in the X direction is accurately positioned above the wiring boards with the fixing tool 17 so as to correspond to the LSI pads 2 (not shown). An opening hole 74 is provided at an area of the n-th wiring board above each of the lands that is brought into contact with the (n+1)th row of the output terminal group 14-$n$ of the probe assembly 1 formed in the (n+1)th wiring board disposed below the n-th wiring board 7-$n$. In this manner, the wiring boards 7 are fixed together at positions where the (n+1)th row of the output terminal group of the probe assembly can be brought into direct contact with the lands formed in (n+1)th wiring board. The lands for the output terminals are connected to peripheral common lands 42 via wiring patterns 72. Common pogo pins 46 communicate with the test unit with electrical signals.

As described above, a probe assembly and a plurality of wiring boards are prepared, the probe assembly including output terminals to be connected directly to the probes and the probe assembly being constituted by integrated regularly-arranged multiple probe groups including the output terminals. In addition, an n-th row of an output terminal group of the probe assembly is brought into contact with a land group provided at an end of an arbitrary n-th wiring board, and a wiring terminal provided at the other end of the n-th wiring board is connected to one of a common wiring board and a connector to establish electrical connection between the to-be-tested semiconductor chips and the test unit. With this configuration, the problems on connection of a narrow-pitched probe assembly and coarse-pitched printed circuit board or connection terminals of connectors can be solved. Thus, testing of electrical property of narrowed pad pitches on semiconductor chips can be facilitated and the cost of the prober unit can be reduced.

The present invention has been described with reference to the preferred embodiments shown in the drawings. However, it will be apparent to those skilled in the art that various changes and can be made without departing from the spirit and scope of the invention. The invention includes any modified embodiments.

What is claimed is:
1. A prober unit in which probes are brought into contact with to-be-tested semiconductor chips to establish electrical connection between the semiconductor chips and a test unit via the probes, wherein:

a probe assembly and a plurality of wiring boards are prepared, the probe assembly including output terminals to be connected directly to the probes, the probe assembly being constituted by integrated regularly-arranged multiple probe groups including the output terminals, and each of the wiring boards including wiring adhering to a surface of a non-conductive film;

an n-th row of an output terminal group of the probe assembly is brought into contact with a land group provided at an end of an arbitrary n-th wiring board, and a wiring terminal provided at the other end of the n-th wiring board is connected to one of a common wiring board and a connector to establish electrical connection between the to-be-tested semiconductor chips and the test unit; and wherein a converting circuit board is provided between wiring terminals of the wiring boards and the common wiring board.

2. A prober unit according to claim 1, wherein an opening is provided at an area of one of a non-conductive section and a conductive section of a wiring board above the n-th wiring board including the n-th wiring board, above a land group that is to be brought into contact with a (n+1)th row of the output terminal group of the probe assembly formed at an area of the (n+1)th wiring board disposed below the n-th wiring board.

3. A prober unit according to claim 1, wherein some or all of the wiring boards are made of flexible flat cables.

4. A prober unit according to claim 1, wherein some or all of the wiring boards are made of multilayer print circuit boards.

5. A prober unit according to claim 1, wherein the probe assembly is fabricated from multiple resin film probes laminated using a support rod, each of the resin film probes including a conductive section having the probes and output terminal sections, the conductive section being fabricated by etching a sheet of copper alloy foil adhering to resin films.

6. A prober unit according to claim 5, wherein the output terminal sections on the resin films are shifted from one another at substantially regular pitches when the resin film probes are laminated together.

7. A prober unit according to claim 1, wherein the support rod used for laminating the resin film probes and the wiring boards are restrained in at least an XY direction (i.e., a direction of a wafer plane) by a support provided on the same support plate.

8. A prober unit according to claim 7, wherein at least the support plate is made of a material having a thermal expansion coefficient similar to that of the semiconductor wafer.

* * * * *